United States Patent [19]

Berg et al.

[11] Patent Number: 4,741,101

[45] Date of Patent: May 3, 1988

[54] CONTACT DEVICE

[75] Inventors: William E. Berg, Portland; Andrew E. Finkbeiner, Beaverton, both of Oreg.

[73] Assignee: Tektronix, Inc., Beaverton, Oreg.

[21] Appl. No.: 913,029

[22] Filed: Sep. 29, 1986

[51] Int. Cl.[4] .............................................. H01R 9/09
[52] U.S. Cl. ..................................... 29/848; 264/266; 439/65
[58] Field of Search ............. 339/17 F, 17 M, 17 LM, 339/61 M, 59 M; 29/846, 848, 849, 883; 264/266, 267; 439/65-73, 592

[56] References Cited

U.S. PATENT DOCUMENTS

| 2,158,044 | 5/1939 | Haller | 264/266 |
| 3,077,658 | 2/1963 | Wharton | 264/266 |
| 4,255,003 | 3/1981 | Berg | 339/61 M |
| 4,575,166 | 3/1986 | Kasdagly et al. | 339/61 M |
| 4,584,767 | 4/1986 | Gregory | 29/848 |
| 4,636,018 | 1/1987 | Stillie | 339/61 M |

FOREIGN PATENT DOCUMENTS 55-15888  2/1980  Japan ..................... 264/266

Primary Examiner—Neil Abrams
Attorney, Agent, or Firm—John Smith-Hill

[57] ABSTRACT

A contact device comprises a resiliently deformable member having two opposite surface regions, and strips of conductive material bonded to the deformable member at one of its two opposite surface regions. The strips of conductive material are of substantially uniform width, substantially parallel to each other and substantially uniformly spaced from each other. The width and spacing of the strips are less than the width and spacing of the terminal areas of the conductor runs that are to be connected by means of the contact device, so that each terminal area contacts at least two strips of the contact device.

4 Claims, 1 Drawing Sheet

U.S. Patent   May 3, 1988   4,741,101
FIG. 1
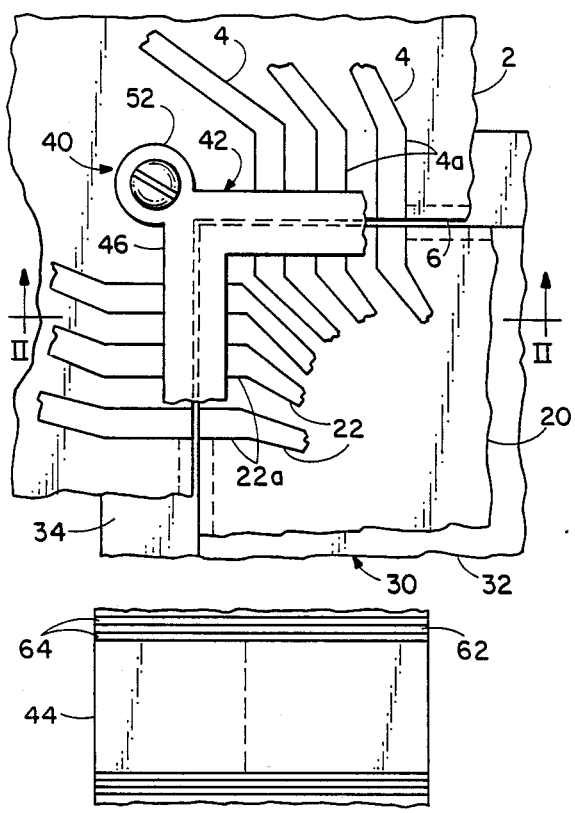
FIG. 2
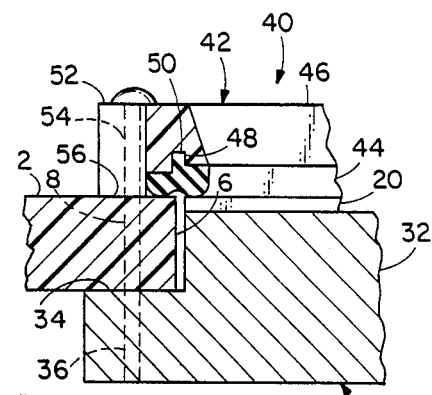
FIG. 3
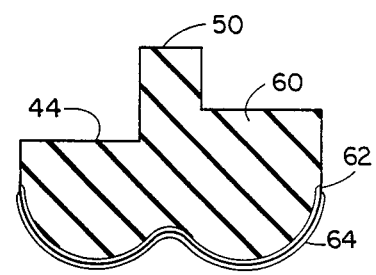
FIG. 4
FIG. 5(a)  FIG. 5(b)  FIG. 5(c)
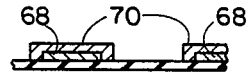
FIG. 5(g)
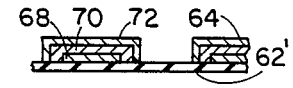
FIG. 5(d)  FIG. 5(e)  FIG. 5(f)
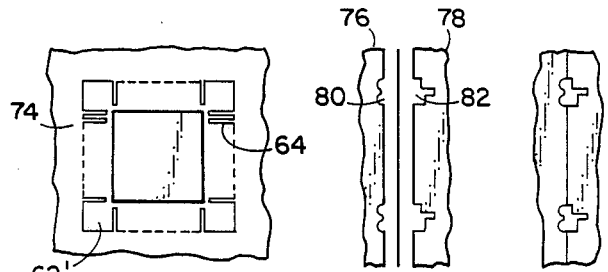
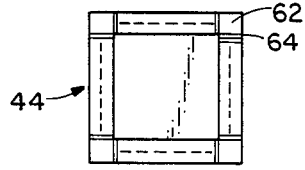

CONTACT DEVICE

This invention relates to a contact device for providing electrical contact between two groups of conductor runs.

BACKGROUND OF THE INVENTION

U.S. Pat. No. 4,255,003 discloses a contact device for providing electrical connection between conductor runs of a hybrid integrated circuit and conductor runs of a printed circuit board. The contact device is a frame-like structure comprising a body of elastomeric material having strips of metal bonded to a surface region of the body, and a clamping member. The metal strips may comprise a base layer of copper-beryllium, a layer of nickel and a layer of gold. In use of a practical implementation of the contact device, the substrate is placed on top of the circuit board, and the clamping member is used to urge the body of elastomeric material into contact with the upper surface of the circuit board and the upper surface of the ceramic substrate. The metal strips provide electrical connection between the conductor runs of the hybrid integrated circuit and the conductor runs of the circuit board. The metal strips are of substantially the same width (0.64 mm) and at substantially the same spacing (0.64 mm) as the terminal areas of the conductor runs. A disadvantage of the device described in U.S. Pat. No. 4,255,003 is that dust or dirt on the terminal areas of the conductor runs or on the metals strips degrade the electrical connection between the conductor runs. This problem could be alleviated if the metal strips were considerably narrower than, and at considerably smaller spacing from, the terminal areas of the conductor runs, so that contact between terminal areas of corresponding conductor runs would be provided by two or more metal strips, in that even if the contact through one strip were degraded it is unlikely that the contact through the other strip(s) also would be degraded. However, the metal strips would then have to be very narrow, e.g. about 0.13 mm, and would therefore be very frail. Such narrow metal strips, if bonded directly to the body of elastomeric material as in the case of U.S. Pat. No. 4,255,003, would have to be etched after bonding in order to avoid damage during handling. However, if the metal strips are of the layered structure described above, the copper-beryllium alloy is liable to be undercut by as much as 0.08 mm if the strips are patterned by conventional selective etching techniques, and this places a lower limit on the width of metal strips that can be formed on a body of silicone rubber in this manner.

SUMMARY OF THE INVENTION

A preferred embodiment of the present invention is a contact device for providing electrical contact between terminal areas of a first group of conductor runs that are exposed along an edge region of a first dielectric substrate and terminal areas of a second group of conductor runs that are exposed along an edge region of a second dielectric substrate, the two edge regions being substantially parallel and the terminal areas of the first group being at substantially the same width and at substantially the same spacing and being substantially in alignment with the terminal areas of the second group. The device comprises a resiliently deformable member and a clamping member. Strips of conductive material are bonded to surface regions of the resiliently deformable member. The strips of conductive material are of substantially uniform width and are substantially parallel to each other and substantially uniformly spaced from each other. The sum of twice the width of a strip plus the space between the strips is less than the width of a terminal area of a conductor run of the first or second group, and the sum of the width of a strip plus twice the space between the strips is less than the space between terminal areas of two adjacent conductor runs of the first or second group. The clamping member urges the resiliently deformable member into contact with the edge regions of the first and second substrates, and the strips of conductive material provide electrical contact between the conductor runs of the first group and the corresponding conductor runs of the second group.

Owing to the relationship between the width and spacing of the strips of conductive material and the width and spacing of the terminal areas of the conductor runs, there are always at least two strips positioned to provide electrical contact between corresponding conductor runs of the first and second groups. Therefore, if the contact between one strip and a conductor run is impaired by dust or dirt, it is likely that the integrity of the connection between the conductor runs will be preserved by the other strip.

BRIEF DESCRIPTION OF THE DRAWINGS

For a better understanding of the invention, and to show how the same may be carried into effect, reference will now be made, by way of example, to the accompanying drawings in which:

FIG. 1 is a partial plan view of a contact device embodying the invention being used to connect a hybrid integrated circuit to a circuit board, FIG. 2 is a sectional view taken on the line II—II of FIG. 1, FIG. 3 is an enlarged sectional view of a component of the contact device, FIG. 4 is a bottom plan view of the component shown in FIG. 3, and FIGS. 5(a) to 5(g) is a series of views illustrating manufacture of the FIG. 3 component.

DETAILED DESCRIPTION

FIGS. 1 and 2 illustrate a circuit board 2 having conductor runs 4. The conductor runs terminate in contact areas 4a that are distributed about the periphery of an aperture 6 in the circuit board. The aperture is generally square, and the circuit board is formed with a hole 8 adjacent each corner of the aperture. A hybrid integrated circuit has a ceramic substrate 20 that is fitted in the aperture and has conductor runs 22 exposed at its upper surface. The conductor runs 22 terminate in contact areas 22a that are distributed about the periphery of the substrate.

The lower face of the substrate engages a heat sink member 30. The heat sink member has a pedestal 32 that enters the aperture of the circuit board, and a shoulder 34 that engages the underside of the circuit board around the periphery of the aperture. The heat sink member has internally threaded holes 36 that are aligned with the holes 8 of the circuit board when the pedestal 32 is fitted in the aperture 6.

A frame-like structure 40 is used to retain the substrate in the aperture 6 of the circuit board. The structure 40 comprises a substantially rigid clamping member 42 and a resiliently deformable member 44. The clamping member 40 has four sides 46, and is formed with an endless groove 48 in its lower surface. The member 44 has an endless ridge 50 that fits in the groove 48. At each corner of the frame-like structure 40 is a mounting ear 52 which is integral with the clamping member 42. The mounting ear is formed with a hole 54. The holes 54 are in the same relative positions as the holes 8 of the circuit board. The ear 52 extends downward beyond the lower surface of the sides 46 and terminates in an abutment surface 56 that engages the upper surface of the circuit board.

Referring now to FIGS. 2 through 5, the deformable member 44 comprises a body 60 of elastomeric material, a sheet 62 of polyimide bonded to the lower surface of the body 60, and connecting strips 64 of metal adhered to the lower surface of the polyimide sheet 62. The strips 64 interconnect corresponding contact areas 4a, 22a and are of uniform width, parallel to each other and uniformly spaced from each other. The strips 64 have widths and are positioned relative to each other such that the sum of twice the width of a strip plus the space between the strips is less than the width of a contact area 4a, 22a. Furthermore, the strips 64 have widths and are positioned relative to each other such that the sum of the width of a strip plus twice the space between the strips is less than the space between the contact areas 4a, 22a. With this relationship between the width and spacing of the strips 64 and the width and spacing of the contact areas 4a, 22a, there are always at least two strips positioned to provide electrical contact between corresponding conductor runs 4, 22.

The member 44 is made from a sheet 62' of polyimide having a continuous layer 66 of copper adhered thereto. A pattern of strips 68 is defined on the layer of copper. The layer of copper is then selectively etched to remove copper of the layer 66 from between the strips, while leaving the field copper (the copper beyond the strips) intact and connected to the strips 68. A layer 70 of nickel is then deposited electrolytically over the exposed copper, and a layer 72 of gold is deposited over the nickel. The nickel serves as a diffusion barrier to prevent diffusion of copper into the layer of gold. The sheet 62' of polyimide, with the strips 64 adhered thereto and with field metal 74 (FIG. 5(d)) still connected to the strips 64, is then placed between the two halves 76, 78 of a mold. The strips 64 are presented towards a pair of endless recesses 80 in the mold half 76. The mold is closed, and silicone rubber is introduced into a recess 82 in the mold half 78. The pressure of the silicone rubber forces the sheet of polyimide to conform to the shape of the recesses 80. The silicone rubber is cured in the mold, and in so doing becomes bonded to the polyimide sheet. The mold is then opened and the polyimide sheet with the body of silicone rubber bonded is removed from the mold. The polyimide sheet is then trimmed, and the deformable member 44 (FIG. 5(g)) is obtained.

This method of manufacturing the deformable member 44 is superior to the method described in U.S. Pat. No. 4,255,003, because it allows narrower connection strips to be produced and allows connection strips of comparable width to be produced at a lower cost.

Further details concerning the construction and use of the frame structure and heat sink member are disclosed in co-pending application Ser. No. 06/912,898 filed Sept. 29, 1986.

It will be appreciated that the present invention is not restricted to the particular method and device that have been described with reference to the drawings, and that modifications may be made therein without departing from the scope of the invention as defined in the appended claims and equivalents thereof.

We claim:

1. A method of manufacturing a resiliently-deformable contact member having multiple discrete contact elements, comprising:
   providing a sheet of flexible dielectric material having multiple discrete contact elements of conductive material adhered to one main face thereof, and
   bonding a body of elastomeric material to an opposite main face of the sheet of flexible material by
   placing the sheet of flexible dielectric material in a mold cavity bounded by a surface which is presented towards but spaced from said conductive material,
   injecting said elastomeric material in uncured form onto said opposite main face, whereby said flexible material is deformed and said conductive material is brought into contact with said surface, and
   curing said elastomeric material.

2. A method according to claim 1, wherein the sheet of flexible materal has a continuous layer of conductive material over said one main face, and the method comprises selectively removing conductive material from said one main face prior to bonding the body of elastomeric materia to said opposite main face.

3. A method according to claim 2, further comprising depositing at least one additional layer of metal on the metal remaining on said one main face after selective removal of metal from said one main face.

4. A method of manufacturing a resiliently-deformable contact member having multiple discrete contact elements, comprising:
   providing a sheet of flexible dielectric material having multiple discrete contact elements of conductive material adhered to one main face thereof, and
   bonding a body of elastomeric material to an opposite main face of the sheet of flexible material by
   providing a mold having first and second mold halves which define a mold cavity,
   placing the sheet of flexible material between the mold halves with said opposite main face presented towards said second mold half, said second mold half having surface portions that are spaced from said conductive material,
   injecting said elastomeric material into the space between said opposite main face and said first mold half, whereby said flexible material is deformed and said conductive material is brought into contact with said surface portions, and
   curing said elastomeric material.

* * * * *